United States Patent
Setoyama et al.

(10) Patent No.: US 12,172,221 B2
(45) Date of Patent: Dec. 24, 2024

(54) CUTTING TOOL

(71) Applicant: Sumitomo Electric Hardmetal Corp., Itami (JP)

(72) Inventors: Makoto Setoyama, Itami (JP); Momoko Iida, Itami (JP); Haruyo Fukui, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 492 days.

(21) Appl. No.: 17/614,560

(22) PCT Filed: Jul. 16, 2020

(86) PCT No.: PCT/JP2020/027614
§ 371 (c)(1),
(2) Date: Nov. 29, 2021

(87) PCT Pub. No.: WO2021/024736
PCT Pub. Date: Feb. 11, 2021

(65) Prior Publication Data
US 2022/0226907 A1   Jul. 21, 2022

(30) Foreign Application Priority Data

Aug. 6, 2019   (JP) .................................. 2019-144611

(51) Int. Cl.
 *B23B 27/14*   (2006.01)
(52) U.S. Cl.
 CPC ........ *B23B 27/148* (2013.01); *B23B 2224/24* (2013.01); *B23B 2226/125* (2013.01)

(58) Field of Classification Search
None
See application file for complete search history.

(56) References Cited

U.S. PATENT DOCUMENTS

| | | | |
|---|---|---|---|
| 5,853,873 A | 12/1998 | Kukino et al. | |
| 2013/0199351 A1* | 8/2013 | Setoyama | ........... C23C 14/5873 156/60 |

(Continued)

FOREIGN PATENT DOCUMENTS

| | | |
|---|---|---|
| EP | 3406751 A1 | 11/2018 |
| JP | 8-119774 A | 5/1996 |

(Continued)

*Primary Examiner* — Seth Dumbris
(74) *Attorney, Agent, or Firm* — XSENSUS LLP

(57) ABSTRACT

A cutting tool comprises a rake face and a flank face, the cutting tool being composed of a substrate made of a cubic boron nitride sintered material and a coating provided on the substrate, the coating including a MAlN layer, when a cross section of the MAlN layer is subjected to an electron backscattering diffraction image analysis to determine a crystal orientation of each of the crystal grains of the $M_xAl_{1-x}N$ and a color map is created based thereon, then on the color map, the flank face having the MAlN layer occupied in area by 45% to 75% by crystal grains of the $M_xAl_{1-x}N$ having a (111) plane with a normal thereto extending in a direction within 25 degrees with respect to a direction in which a normal to the flank face extends, the MAlN layer having a residual stress of –2 GPa to –0.1 GPa.

6 Claims, 6 Drawing Sheets

(56) References Cited

U.S. PATENT DOCUMENTS

| | | |
|---|---|---|
| 2018/0029144 A1* | 2/2018 | Ono ................... B23B 27/148 |
| 2018/0093331 A1* | 4/2018 | Paseuth ............... C23C 28/044 |
| 2019/0151956 A1* | 5/2019 | Paseuth ................ B23B 27/14 |

FOREIGN PATENT DOCUMENTS

| JP | 2005-344148 A | 12/2005 |
|---|---|---|
| JP | 2008-106287 A | 5/2008 |
| JP | 2009-203485 A | 9/2009 |
| JP | 2010-84153 A | 4/2010 |
| JP | 2010-94763 A | 4/2010 |
| JP | 2015-160259 A | 9/2015 |

\* cited by examiner

CUTTING TOOL

CROSS-REFERENCE TO RELATED APPLICATIONS

The present application is based on PCT filing PCT/JP2020/027614, filed Jul. 16, 2020, which claims priority to Japanese Patent Applications No. 2019-144611, filed on Aug. 6, 2019, the entire contents of each are incorporated herein by reference.

TECHNICAL FIELD

Technical Field

The present disclosure relates to a cutting tool.

Background Art

Cubic boron nitride (hereinafter also referred to as "cBN") has a hardness second to that of diamond, and is also excellent in thermal stability and chemical stability. In addition, cBN is more stable for iron-based materials than diamond is, and a cBN sintered material has been used as cutting tools for processing iron-based materials.

Further, in order to enhance a cutting tool made of a cBN sintered material in wear resistance and the like, it has been studied to provide a coating on a substrate of the cBN sintered material.

CITATION LIST

Patent Literature

PTL 1: Japanese Patent Application Laid-Open No. 08-119774

SUMMARY OF INVENTION

The presently disclosed cutting tool is
a cutting tool comprising a rake face and a flank face,
the cutting tool being composed of a substrate made of a cubic boron nitride sintered material and a coating provided on the substrate,
the cubic boron nitride sintered material including cubic boron nitride,
the coating including a MAlN layer,
in the MAlN layer, M representing a metal element including titanium, chromium, or both,
the MAlN layer including crystal grains of $M_xAl_{1-x}N$ in the cubic crystal system,
in the $M_xAl_{1-x}N$, the metal element M having an atomic ratio x of 0.3 or more and 0.7 or less,
the cubic boron nitride being contained at a ratio of 20% by volume or more with respect to the cubic boron nitride sintered material,
when a cross section of the MAlN layer obtained when cut along a plane including a normal to the flank face is subjected to an electron backscattering diffraction image analysis using a field emission scanning microscope to determine a crystal orientation of each of the crystal grains of the $M_xAl_{1-x}N$ and a color map is created based thereon, then on the color map,
the flank face having the MAlN layer occupied in area by 45% or more and less than 75% by crystal grains of the $M_xAl_{1-x}N$ having a (111) plane with a normal thereto extending in a direction within 25 degrees with respect to a direction in which a normal to the flank face extends,
the MAlN layer having a residual stress of −2 GPa or more and −0.1 GPa or less.

DETAILED DESCRIPTION

Figure 1:
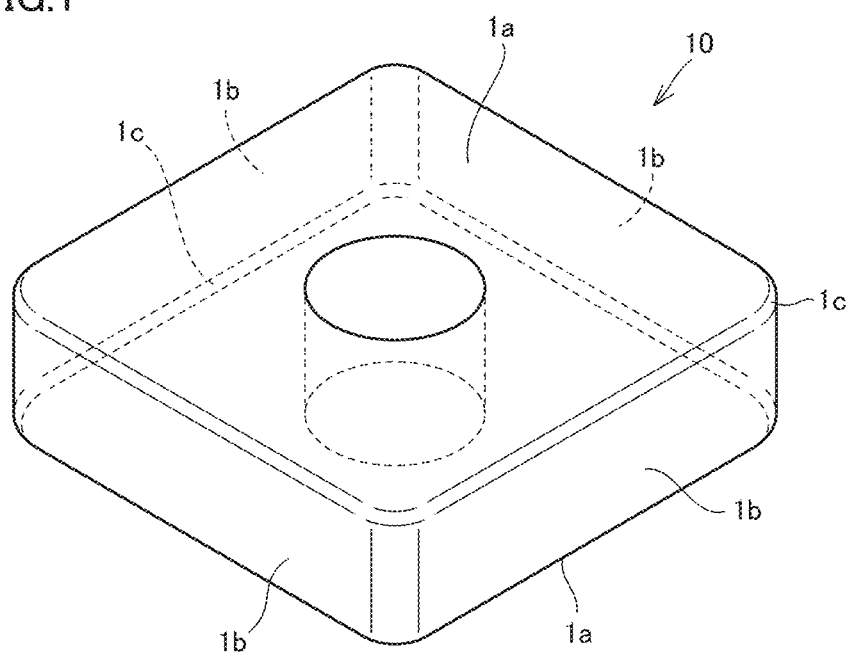
FIG. 1 is a perspective view of a cutting tool according to one embodiment in one manner.

Problem to be Solved by the Present Disclosure

For example, Japanese Patent Laying-Open No. 08-119774 (PTL 1) discloses a composite high-hardness material for a tool having a substrate made of a CBN sintered material including 20% by volume or more of cubic boron nitride or a substrate made of a diamond sintered material including 40% or more of diamond, characterized in that at least one layer of hard heat-resistant coating containing at least one element selected from C, N and O, Ti, and Al as main components is provided at least at a portion involved in cutting.

However, the hard heat-resistant coating in the composite high-hardness material for a tool described in PTL 1 has variation observed in crystal orientation of crystal grains constituting the hard heat-resistant coating, and there is room for improvement in hardness. Therefore, further improvement in performance (e.g., wear resistance, chipping resistance, etc.) is required when applied to highly efficient cutting (e.g., cutting with a high feed rate)

The present disclosure has been made in view of the above circumstances, and an object thereof is to provide a cutting tool excellent in wear resistance and chipping resistance.

Advantageous Effect of the Present Disclosure

According to the present disclosure, a cutting tool excellent in wear resistance and chipping resistance can be provided.

Description of Embodiments of the Present Disclosure

Initially, embodiments of the present disclosure will be listed and described.

[1] The presently disclosed cutting tool is
a cutting tool comprising a rake face and a flank face,
the cutting tool being composed of a substrate made of a cubic boron nitride sintered material and a coating provided on the substrate,
the cubic boron nitride sintered material including cubic boron nitride,
the coating including a MAlN layer,
in the MAlN layer, M representing a metal element including, titanium, chromium, or both,
the MAlN layer including crystal grains of $M_xAl_{1-x}N$ in the cubic crystal system,
in the $M_xAl_{1-x}N$, the metal element M having an atomic ratio x of 0.3 or more and 0.7 or less,
the cubic boron nitride being contained at a ratio of 20% by volume or more with respect to the cubic boron nitride sintered material,
when a cross section of the MAlN layer obtained when cut along a plane including a normal to the flank face is subjected to an electron backscattering diffraction image analysis using a field emission scanning microscope to determine a crystal orientation of each of the crystal grains of the $M_xAl_{1-x}N$ and a color map is created based thereon, then on the color map,
the flank face having the MAlN layer occupied in area by 45% or more and less than 75% by crystal grains of the $M_xAl_{1-x}N$ having a (111) plane with a normal thereto extending in a direction within 25 degrees with respect to a direction in which a normal to the flank face extends,
the MAlN layer having a residual stress of −2 GPa or more and −0.1 GPa or less.

The cutting tool has a flank face having the MAlN layer (e.g. TiAlN layer) occupied, as observed in the color map, by a number of crystal grains of the $M_xAl_{1-x}N$ having a (111) plane with a normal thereto extending in a direction within 25 degrees with respect to a direction in which a normal to the flank face extends, the number being a prescribed ratio. Therefore, in the flank face, the MAlN layer is excellent hardness. Further, the MAlN layer is small in compressive residual stress and thus suppresses chipping. That is, by having the above-described configuration, the cutting tool can be excellent in wear resistance and chipping resistance. As referred to herein, "chipping resistance" means resistance to small chipping caused in the coating.

[2] The metal element M preferably further includes at least one element selected from the group consisting of boron, silicon, vanadium, zirconium, niobium, molybdenum, hafnium, tantalum, and tungsten. Such a definition allows the cutting tool to be further excellent in wear resistance, and excellent in heat resistance and lubricity.

[3] Preferably, the flank face has the MAlN layer occupied in area by 55% or more and less than 75% by crystal grains of the $M_xAl_{1-x}N$ having the (111) plane with the normal thereto extending in the direction within 25 degrees with respect to the direction in which the normal to the flank face extends. Such a definition allows the cutting tool to be further excellent in wear resistance and chipping resistance.

[4] The coating preferably has a thickness of 0.5 μm or more and less than 10 μm. Such a definition allows the cutting tool to be further excellent in wear resistance and chipping resistance.

[5] Preferably, the MAlN layer further includes Ar, and the Ar is contained at a ratio of 0.1 at % or more and 5 at % or less with respect to the MAlN layer. Such a definition allows the cutting tool to be further excellent in chipping resistance.

[6] Preferably, in the cross section of the MAlN layer obtained when cut along the plane including the normal to the flank face, a number no of droplets per 50 μm in length of the MAlN layer in the flank face is two or less. Such a definition allows the cutting tool to be further excellent in wear resistance and chipping resistance.

Detailed Description of Embodiment of the Present Disclosure

Hereinafter, an embodiment of the present disclosure (hereinafter also referred to as "the present embodiment") will be described. It should be noted, however, that the present embodiment is not exclusive. In the present specification, an expression in the form of "A to Z" means a range's upper and lower limits (that is, A or more and Z or less), and when A is not accompanied by any unit and Z is alone accompanied by a unit, A has the same unit as Z. Further, in the present specification, when a compound is represented by a chemical formula with its constituent elements' compositional ratio unspecified, such as "TiN," the chemical formula shall encompass any conventionally known compositional ratio or elemental ratio). The chemical formula shall include not only a stoichiometric composition but also a nonstoichiometric composition. For example, the chemical formula of "TiN" includes not only a stoichiometric composition of "$Ti_1N_1$" but also a non-stoichiometric composition for example of "$Ti_1N_{0.8}$." This also applies to descriptions for compounds other than "TiN."

<<Surface-Coated Cutting Tool>>

The presently disclosed cutting tool is
a cutting tool comprising a rake face and a flank face,
the cutting tool being composed of a substrate made of a cubic boron nitride sintered material and a coating provided on the substrate,
the cubic boron nitride sintered material including cubic boron nitride,
the coating including a MAlN layer,
in the MAlN layer, M representing a metal element including titanium, chromium, or both,
the MAlN layer including crystal grains of $M_xAl_{1-x}N$ in the cubic crystal system,
in the $M_xAl_{1-x}N$, the metal element M having an atomic ratio x of 0.3 or more and 0.7 or less,
the cubic boron nitride being contained at a ratio of 20% by volume or more with respect to the cubic boron nitride sintered material,
when a cross section of the MAlN layer obtained when cut along a plane including a normal to the flank face is subjected to an electron backscattering diffraction image analysis using a field emission scanning microscope to determine a crystal orientation of each of the crystal grains of the $M_xAl_{1-x}N$ and a color map is created based thereon, then on the color map,
the flank face having the MAlN layer occupied in area by 45% or more and less than 75% by crystal grains of the $M_xAl_{1-x}N$ having a (111) plane with a normal thereto extending in a direction within 25 degrees with respect to a direction in which a normal to the flank face extends,
the MAlN layer having a residual stress of −2 GPa or more and −0.1 GPa or less.

The surface coated cutting tool according to the present embodiment (hereinafter also simply referred to as a "cutting tool") can for example be a drill, an end mill, an indexable cutting insert for a drill, an indexable cutting insert for an end mill, an indexable cutting insert for milling, an indexable cutting insert for turning, a metal saw, a gear cutting tool, a reamer, a tap, or the like.

FIG. 1 is a perspective view of a cutting tool according to one embodiment in one manner. A cutting tool 10 having such a shape is used as an indexable cutting insert for turning.

Cutting tool 10 shown in FIG. 1 has a surface including a top surface, a bottom surface, and four side surfaces, and is generally in the form of a quadrangular prism which is more or less smaller in thickness in the vertical direction. Further, cutting tool 10 has a throughhole penetrating it through the top and bottom surfaces, and the four side surfaces at their boundary portions have adjacent ones thereof connected by an arcuate surface.

Cutting tool 10 normally has the top and bottom surfaces to form a rake face 1a, the four side surfaces (and each arcuate surface connecting adjacent ones thereof together) to form a flank face 1b, and a surface connecting rake face 1a and flank face 1b together to form a cutting edge face 1c. A "rake face" means a face ejecting chips produced from a workpiece as it is cut. A "flank face" means a face partially brought into contact with the workpiece. The cutting edge face is included in a portion configuring the cutting edge of the cutting tool.

When the cutting tool is an indexable rutting insert, cutting tool 10 also includes a shape with or without a chip breaker. While FIG. 1 shows the cutting tool having a cuffing edge shaped to be a flat surface (i.e., cutting edge face 1c), the cutting edge's shape is not limited thereto. That is, the cutting edge has a shape including that of a sharp edge (that is, a ride formed by the rake face and the flank face) (see FIG. 3 for example) and that of a negative land (that is, a chamfered shape) (see FIG. 2 for example).

While the shape of cutting tool 10 and the name of each part thereof have been described with reference to FIGS. 1 to 3, similar terminology will be used to indicate a shape of the substrate of cutting tool 10 according to the present embodiment and the name of each part thereof that correspond to those of cutting tool 10. That is, the substrate of the cutting tool has a rake face and a flank face. The substrate may have a cutting edge face connecting the rake face and the flank face together.

Figure 4:
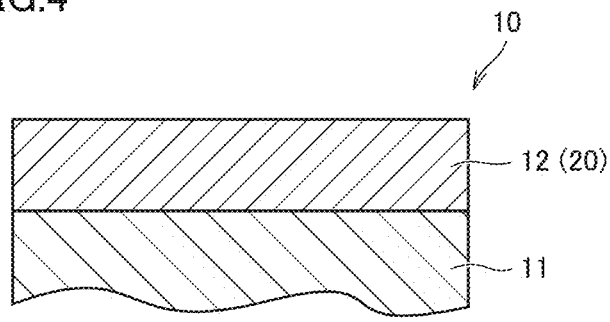
FIG. 4 is a schematic cross section of a cutting tool according to the present embodiment in another manner.

Cutting tool 10 comprises a substrate 11 and an MAlN layer 12 provided on substrate 11 (see FIG. 4). In addition to MAlN layer 12, cutting tool 10 may further include an underlying layer 13 provided between substrate 11 and MAlN layer 12 (see FIG. 5). Cutting tool 10 may further include a surface layer 14 provided on MAlN layer 12 (see FIG. 5). Other layers such as underlying layer 13 and surface layer 14 will be described hereinafter.

Figure 2:
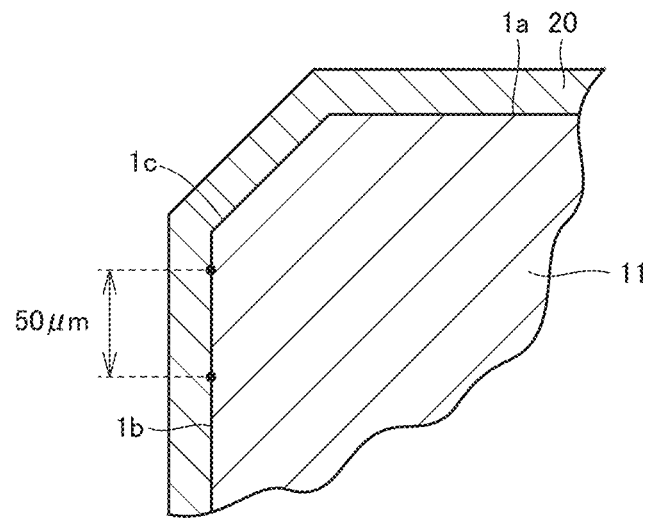
FIG. 2 is a schematic cross section of a cutting tool according to the present embodiment in one manner.
Figure 3:
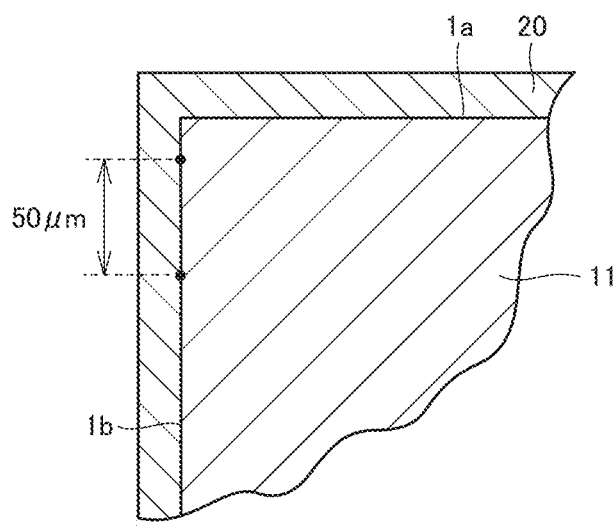
FIG. 3 is a schematic cross section of a cutting tool according to the present embodiment in another manner.
Figure 5:
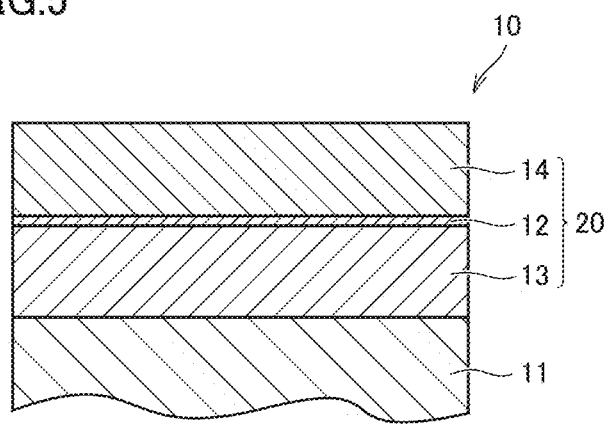
FIG. 5 is a schematic cross section of a cutting tool according to the present embodiment in another manner.

The above-described layers provided on the substrate may be collectively referred to as a "coating." That is, cutting tool 10 comprises a coating 20 coating substrate 11 (see FIGS. 2 and 3). Coating 20 includes MAlN layer 12 (see FIG. 4). Further, coating 20 may further include underlying layer 13 or surface layer 14 (FIG. 5).

<Substrate>
<<Cubic Boron Nitride Sintered Material>>

The substrate of the present embodiment is made of a cubic boron nitride (cBN) sintered material. The cubic boron nitride sintered material includes cubic boron nitride. In one aspect of the present embodiment, the cubic boron nitride sintered material preferably further includes a binder.

(Cubic Boron Nitride)

In the present embodiment, "cubic boron nitride" means crystal grains of cubic boron nitride in the cubic crystal system. That is, the cubic boron nitride sintered material includes cubic boron nitride.

The cubic boron nitride preferably has an average grain diameter R of 0.8 µm or more and 5 µm or less, more preferably 1 µm or more and 4 µm or less.

Average grain diameter R can be determined by a cutting method using a scanning electron microscope (SEM). Specifically, initially, any surface or cross section of the cubic boron nitride sintered material is mirror-finished. Subsequently, the processed surface of the cubic boron nitride sintered material is observed with an SEM at a magnification of 1,000 to 10,000 times to obtain an SEM image.

Subsequently, a circle is drawn in the SEM image, and eight straight lines are drawn radially from the center of the circle (such that each straight line and another straight line form a substantially equal intersection angle) to the circle's circumference. In doing so, the magnification for the observation and the diameter of the circle are preferably set such that approximately 10 to 50 cubic boron nitride (crystal grains) are seen per straight line.

Subsequently, how many grain boundaries of the cubic boron nitride are traversed is counted for each straight line and the length of the straight line is divided by the number of traversed grain boundaries to obtain an average segmental length. Finally, the average segmental length is multiplied by 1.128 to obtain a numerical value, which serves as the average grain diameter of the cubic boron nitride (Note that this method is pursuant to a method for calculating a nominal grain diameter according, to the ASTM standard). Note that such an average grain diameter is suitably such that more preferably, several SEM images are used to obtain an average grain diameter for each image in the above method and an average value of such average grain diameters thus obtained serves as the average grain diameter of the cubic boron nitride. A measurement in such a method as described above has a possibility of including a grain diameter of grains other than cubic boron nitride (for example, crystal grains of wurtzite type boron nitride), and even when another grain's grain diameter is thus included, it is also included in determining an average grain diameter of the cubic boron nitride.

The cubic boron nitride is contained relative to the cubic boron nitride sintered material at a ratio of 20% by volume or more, preferably 20% by volume or more and 97% by volume or less, more preferably 20% by volume or more and 80% by volume or less. The ratio of the cubic boron nitride contained is determined by capturing an image of a sample of the cubic boron nitride sintered material, in a cross section as described above, with an SEM, and analyzing the captured image. That is, it can be calculated by identifying crystal grains of cubic boron nitride in a predetermined field of view, performing image-processing to calculate a sum in area of the identified crystal grains, and dividing the sum by the area of the field of view. Furthermore, it is preferable that the same cubic boron nitride sintered material undergo the above image analysis in a plurality of fields of view (for example, five or more fields of view) and an average value thereof be determined as the ratio of the cubic boron nitride contained. For the above image processing, an image analysis type particle size distribution analysis software ("Mac-View" manufactured by Maumee Co., Ltd) can be suitably used. The "predetermined field of view" may be the same as the field of view used in obtaining an average grain diameter of crystal grains of the cubic boron nitride, as has been described above.

While the ratio obtained in the above-described method is a ratio in area of the cubic boron nitride in a field of view, in the present embodiment the ratio is regarded as a ratio in volume and thus handled. That is, when the cubic boron nitride has a ratio in area of 20% as determined in the above method, the cubic boron nitride will be regarded as being contained at a ratio of 20% by volume with respect to the cubic boron nitride sintered material.

(Binder)

In the present embodiment, a "binder" means a substance that binds crystal grains of the cubic boron nitride together. The binder preferably includes a compound consisting of: at least one element selected from the group consisting of a group 4 element, a group 5 element and a group 6 element of the periodic table of elements, Al (aluminum), and Si (silicon); and at least one element selected from the group consisting of C (carbon), N (nitrogen), B (boron) and O (oxygen).

Examples of the group 4 element for example include Ti (titanium), Zr (zirconium), and Hf (hafnium). Examples of the group 5 element for example include V (vanadium), Nb (niobium), and Ta (tantalum). Examples of the group 6 element, for example include Cr (chromium), Mo (molybdenum), and W (tungsten). The binder's each component can be determined by analyzing a region of a sample of the cutting tool including the above-described cross section that corresponds to the binder through energy dispersive x-ray spectroscopy accompanying an SEM (SEM-EDX). This is done by observing the sample at a magnification for example of 10,000 times.

Examples of the compound consisting of: at least one element selected from the group consisting of a group 4 element, a group 5 element and a group 6 element of the periodic table of elements, Al, and Si; and at least one element selected from the group consisting of C, N, B and O include a nitride such as TiN and AlN, a carbide such as TiC and WC, a boride such as $TiB_2$ and $AlB_2$, an oxide such as $Al_2O_3$ and the like, or TiCN, AlON, SiAlON, SiTiAlON and the like.

(Inevitable Impurities)

The cubic boron nitride sintered material may include inevitable impurities within a range that does not impair an effect that the present disclosure has. Inevitable impurities collectively refer to elements and compounds that may be contained in a trace amount in raw materials for the cubic boron nitride sintered material or in producing it. Elements and compounds contained as inevitable impurities are each contained in an amount (in % by volume) of 0% by volume or more and 5% by volume or less, and a total of these (that is, a total content of trace impurities) is 0% by volume or more and 5% by volume or less. Therefore, inevitable impurities may or may not be contained in the cubic boron nitride sintered material. Examples of inevitable impurities include Li, Mg, Ca, Sr, Ba, Be, Si, Ga, La, Fe, and Cu.

<Coating>

The coating according to the present embodiment includes a MAlN layer. In the MAlN layer, M represents a metal element including titanium, chromium, or both. The "coating" coats at least a portion of the substrate (for example, a portion of the rake face and a portion of the flank face) to exhibit a function to improve the cutting tool's various characteristics such as chipping resistance, wear resistance and the like. The coating preferably coats the entire surface of the substrate. However, even if the substrate is partially uncoated with the coating or the coating is partially different in configuration, such does not depart from the scope of the present embodiment.

The coating preferably has a thickness of 0.5 µm or more and less than 10 µm, more preferably 1 µm or more and 5 µm or less. Note that the thickness of the coating means a total thickness of any layers constituting the coating. A "layer constituting the coating" for example includes the MAlN layer, an intermediate layer, which will be described hereinafter, the underlying and surface layers described above, and other like layers. For example, the thickness of the coating can be determined by measuring any 10 points in a cross-sectional sample of the coating parallel to the direction offer normal to a surface of the substrate with an SEM, and calculating an average value in thickness of the measured 10 points. The measurement is done at a magnification for example of 10,000 times. The same applies when measuring in thickness the MAlN layer, the intermediate layer, the underlying and surface layers, and the like. The SEM is JEM-2100F (trade name) manufactured by JEOL Ltd., for example.

(MAlN Layer)

The MAlN layer includes crystal grains of $M_xAl_{1-x}N$ in the cubic crystal system. That is, the MAlN layer is a layer including polycrystalline $M_xAl_{1-x}N$. The cubic $M_xAl_{1-x}N$ crystal grains are identified for example by a pattern of a diffraction peak obtained through x-ray diffraction.

In the MAlN layer, M represents a metal element. The metal element M includes titanium, chromium, or both. In one aspect of the present embodiment, the metal element M preferably further includes at least one element selected from the group consisting of boron, silicon, vanadium, zirconium, niobium, molybdenum, hafnium, tantalum, and tungsten (hereinafter also referred to as a "third element"). While boron is normally considered as a semimetal that exhibits an intermediate property between a metallic element and a nonmetallic element, for the MAlN layer of the present embodiment, an element having free electron is regarded as a metal, and boron shall be included in the range of metallic elements.

In one aspect of the present embodiment, the metal element M is preferably titanium. That is, preferably, the coating includes a TiAlN layer as the MAlN layer, and the TiAlN layer includes crystal grains of $Ti_xAl_{1-x}N$ in the cubic crystal system. Note that the TiAlN layer is a layer including polycrystalline $Ti_xAl_{1-x}N$. The cubic $Ti_xAl_{1-x}N$ crystal grains are identified for example by a pattern of a diffraction peak obtained through x-ray diffraction.

In the $M_xAl_{1-x}N$, the metal element Ni preferably has an atomic ratio x of 0.3 or more and 0.7 or less, preferably 0.32 or more and 0.55 or less. The x can be determined by subjecting the above-described cross-sectional sample to energy dispersive x-ray spectroscopy accompanying an SEM (SEM-EDX) to subject the MAlN layer entirely to an elemental analysis. This is done by observing the sample at a magnification for example of 20,000 times. Specifically, any 10 points in the MAlN layer in the cross-sectional sample is each measured to obtain a value of the x, and an average value of such values obtained at the 10 points is defined as x in the MAlN layer. Note that when the metal element M includes a plurality of metal elements, a sum of the atomic ratios of the metal elements will be the atomic ratio x of the metal element M. Further, "any 10 points" are selected from different crystal grains of the MAlN layer. A ratio at which the MAlN layer contains Ar, as will be described hereinafter, is similarly determined. The EDX device is JED-2300 (trade name) manufactured by JEOL Ltd., for example.

When the metal element M includes titanium, the titanium in the $M_xAl_{1-x}N$ has an atomic ratio w preferably of larger than 0 and 0.7 or less, more preferably 0.2 or more and 0.6 or less. Note that when the metal atom M is titanium alone, the atomic ratio x of the metal element M matches the atomic ratio w of titanium as a matter of course.

When the metal element M includes chromium, the chromium in the $M_xAl_{1-x}N$ has an atomic ratio y preferably of larger than 0 and 0.7 or less, more preferably 0.2 or more and 0.6 or less. Note that when the metal atom M is chromium alone, the atomic ratio x of the metal element M matches the atomic ratio y of chromium as a matter of course.

When the metal element Ni includes the third element, the third element in the $M_xAl_{1-x}N$ has an atomic ratio z preferably of larger than 0 and 0.7 or less, more preferably 0.01 or more and 0.3 or less. Note that when the third element includes a plurality of metal elements, a sum of the atomic ratios of the metal elements will be the atomic ratio z of the third element.

The MAlN layer preferably has a thickness of 0.05 μm or more and 10 μm or less, more preferably 0.3 μm or more and 4 μm or less. When the MAlN layer is contained in the coating as a plurality of layers, the thickness of the MAlN layer means a thickness per layer. The thickness can be measured for example by observing such a cross section as described above of the cutting tool with an SEM at a magnification of 10,000 times.

The MAlN layer may be included in the coating as a single MAlN layer or a plurality of (e.g., 2 to 10) MAlN layers. The MAlN layer may form a multilayer structure in which the MAlN layer and another layer, such as an intermediate layer described hereinafter, are stacked alternately. In one aspect of the present embodiment, the MAlN layer may per se form a multilayer structure.

(Crystal Orientation in the MAlN Layer of Flank Face)

In the present embodiment, when a cross section of the MAlN layer obtained when cut along a plane including a normal to the flank face is subjected to an electron backscattering diffraction image analysis using a field emission scanning microscope to determine a crystal orientation of each of the crystal grains of the $M_xAl_{1-x}N$ and a color map is created based thereon, then on the color map, the flank face preferably has the MAlN layer occupied in area by 45% or more and less than 75%, preferably 55% or more and less than 75% by crystal grains of the $M_xAl_{1-x}N$ having a (111) plane with a normal thereto extending in a direction within 25 degrees with respect to a direction in which a normal to the flank face extends (hereinafter also referred to as "(111) oriented crystal grain").

Figure 6:
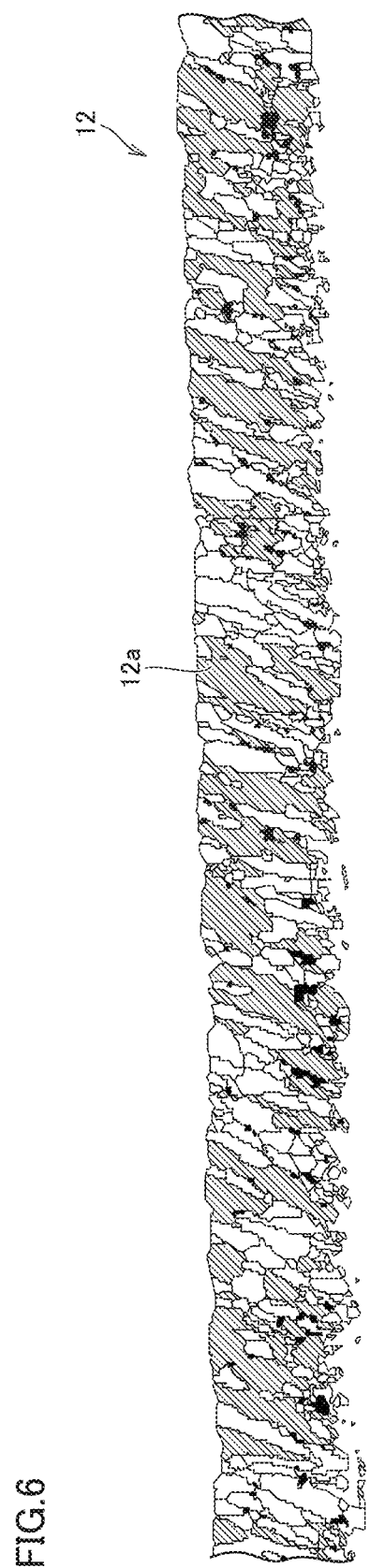
FIG. 6 is schematic diagram of an enlarged SEM image of a cross section of the cutting tool according to the present embodiment.

Reference will now be made to FIG. 6 to specifically describe a method for creating the color map. Initially, the MAlN layer is formed on a substrate based on a method described hereinafter. The formed MAlN layer is cut so as to obtain a cross section perpendicular to the MAlN layer including the substrate and the like. That is, the MAlN layer is cut so as to expose a cut surface thereof cut along the plane including the normal to the flank face. After that, the cut surface is polished with waterproof abrasive paper (including SiC grain abrasive as an abrasive).

Note that the cutting is done for example as follows: wax or the like is used to closely fix MAlN layer 12 at a surface thereof (or a surface of a coating when another layer is formed on MAlN layer 12) on a sufficiently large holding flat plate and thereafter, a rotary blade cutter is used to cut the layer in a direction perpendicular to the flat plate (i.e., cut the layer such that the rotary blade is as perpendicular as possible to the flat plate). While this cutting can be performed at any portion of MAlN layer 12 insofar as it is performed in such a vertical direction, it is preferably done in a vicinity of a portion involved in the cutting.

Furthermore, the cut surface is polished, as described above, with the above waterproof abrasive paper (with #400, followed by #800 followed by #1500). The numbers (#) of the waterproof abrasive paper mean differences in grain size of the abrasive, and a larger number indicates that the abrasive has a smaller grain size.

Subsequently, the polished surface is further smoothed by ion milling using Ar ions. The ion milling is performed under the following conditions:

Acceleration voltage: 6 kV

Irradiation angle: 0° from the direction of a normal to the MAlN layer (that is, the direction of a straight line parallel to the direction of the thickness of the MAlN layer at the cut surface)

Irradiation time: 8 hours

Subsequently the smoothed cross-section (a mirror surface) is observed with a field emission type scanning, electron microscope (FE-SEM) (product name: "SU6600" manufactured by Hitachi High-Tech Corporation) equipped with an electron back-scattered diffractometer (an EBSD device) to obtain an image, which is subjected to an EBSD analysis. While which portion of the smoothed cross section is observed is not particularly limited, it is preferable to observe it in a vicinity of a cutting edge portion. The observation with the FE-SEM is conducted at a magnification of 5000 times.

For the EBSD analysis, data is successively collected by positioning a focused electron beam on each pixel individually. A normal to a sample surface (the smoothed cross section of the MAlN layer) is inclined by 70 degrees with respect to the incident beam, and the analysis is conducted at 15 kV. A high current mode is used in conformity with an aperture diameter of 60 μm or 120 μm. Data is collected on the cross section for 60×500 points corresponding to a surface area (an observation area) of 6 μm (in the direction of the thickness of the MAlN layer)×50 μm (in a direction parallel to an interface of the MAlN layer) in steps of 0.1 μm/step. In doing so, measurement is done in three or more fields of view.

A result of the EBSD analysis is analyzed using commercially available software (trade name: "Orientation Imaging Microscopy Ver 6.2," manufactured by EDAX Inc.) to create the color map. Specifically, initially, the crystal orientation of each crystal grain included in the cross section of MAlN layer 12 is determined. Based on the crystal orientation of each crystal grain determined, the crystal orientation of each crystal grain in the direction of a normal to a surface of MAlN layer 12 was determined. A color map is created based on the determined crystal orientation. To create the color map, a "Crystal Direction MAP" method included in the above software can be used. The color map is created throughout an area of MAlN layer 12 in the direction of the thickness as observed in the cut surface. In addition, a crystal grain partially outside a measurement field of view is also counted as one crystal grain.

In FIG. 6, each area surrounded by a solid line and hatched is a (111) oriented crystal grain 12a. Further, each area surrounded by a solid line and unhatched is a crystal grain which does not correspond to the (111) oriented crystal grain. That is, in FIG. 6, crystal grains 12a having a (111)

plane with a normal thereto having a direction within 25° with respect to the direction of the normal to the surface of MAlN layer 12 is hatched. Furthermore, in FIG. 6, there is an area shown in black, which is regarded as an area of a crystal grain having its crystal orientation undetermined in the above method.

Subsequently, in the color map of each field of view, the area of the (111) oriented crystal grains in the MAlN layer of the flank face and the area of all crystal grains in the MAlN layer of the flank lace are determined, and the ratio in area occupied by the (111) oriented crystal grains is determined based on the expression indicated below. Note that the "area of all crystal grains" means the "area of the entirety of a measurement field of view."

Ratio in area occupied by (111) oriented crystal grains={area of (111) oriented crystal grains/ area of the entirety of a measurement field of view}×100(%)

The ratio in area occupied by the (111) oriented crystal grains obtained in each field of view is averaged together with such ratios obtained in the other fields of view to calculate the ratio in area occupied by the (111) oriented crystal grains. When a plurality of MAlN layers are included in the coating, at least one of the plurality of MAlN layers satisfying the above ratio in area occupied by (111) oriented crystal grains suffices.

(Residual Stress in MAlN Layer)

The MAlN layer preferably has residual stress of −2 GPa or more and −0.1 GPa or less, more preferably −1.5 GPa or more and −0.3 GPa or less. When a plurality of MAlN layers are included in the coating, at least one of the plurality of MAlN layers satisfying the above-indicated value of residual stress suffices.

The MAlN layer's residual stress means an internal stress (or intrinsic strain) present in the MAlN layer. Of the residual stress in the MAlN layer, that residual stress expressed by a negative value (a negative numerical value) (as a unit therefor, "GPa" is used in the present embodiment) is referred to as compressive residual stress. Of the residual stress in the MAlN layer, that residual stress expressed by a positive value (a positive numerical value) (as a unit therefor, "GPa" is used in the present embodiment) is referred to as tensile residual stress.

The residual stress can be determined in the $2\theta\text{-}\sin^2\psi$ method (or side inclination method) using an X-ray. Specifically, the MAlN layer is analyzed at any three points in the $2\theta\text{-}\sin^2\psi$ method using an X-ray, and an average of values in residual stress obtained at these three points is defined as the residual stress in the MAlN layer. The three points may be any three points, and three points on the flan face may be selected.

Measurement in the $2\theta\text{-}\sin^2\psi$ method (or side inclination method) using an X-ray is conducted under the following conditions. Note that measurement is done using a sample having a thickness of 5 μm.

(Measurement Conditions)
X-ray output: 10 keV
X-ray source: radiated light
Measured surface: flank face
Position of depth of X-ray irradiation: 2 μm
Detector: flat panel
Condensing size: 140 nm×230 nm
Scan axis: 2θ/θ
Scan mode: continuous (Ratio of Ar Contained in MAlN Layer)

The MAlN layer may further include Ar. Ar is contained in the MAlN layer at a ratio (in atomic percent) preferably of 0.1 at % or more and 5 at % or less, more preferably 0.1 at % or more and 1 at % or less with respect to the MAlN layer. The ratio of Ar contained in the MAlN layer can be determined by analyzing the above cross-sectional sample with a SEM-EDX throughout the MAlN layer. When a plurality of MAlN layers are included in the coating, at least one of the plurality of MAlN layers satisfying the above Ar content ratio suffices.

(Number of Droplets in the MAlN Layer at Flank Face)

In the present embodiment, a number nu of droplets per 50 μm in length of the MAlN layer at the flank face in a cross section of the MAlN layer obtained when the MAlN layer is cut along the plane including the normal to the flank face, is preferably 2 or less, more preferably 0 or more and 2 or less.

In the present embodiment, a "droplet" means a grain of metal that is present in a layer configuring the coating (for example, the MAlN layer such as a TiAlN layer) and has a predetermined size as will be described hereinafter.

The number of droplets is counted through the following procedure: Initially, the above-described cross section of the cutting tool is observed with an SEM at a magnification of 5,000 times to obtain an SEM image. In doing so, the SEM image is obtained so that the MAlN layer is continuously included in a range of a length of 50 μm (a length in a direction perpendicular to the direction of the thickness of the MAlN layer). The number of SEM images to be obtained is not particularly limited insofar as the MAlN layer is included in the range of the length of 50 μm, and it may be one field of view or a plurality of fields of view. When SEM images are obtained in a plurality of fields of view, the SEM images may initially be joined together and the number of droplets may be counted subsequently. One field of view may have a size for example of 25 μm×20 μm.

Figure 7:
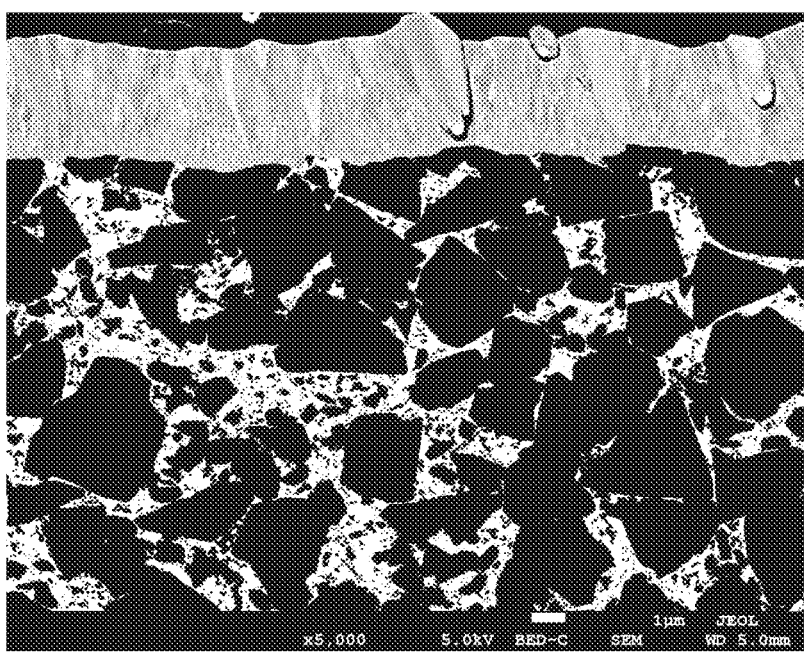
FIG. 7 is an enlarged SEM image of a cross section in a cutting tool of a comparative example.

The obtained SEM image is visually confirmed, and a white, generally round portion present in the MAlN layer (for example, in a layer indicated in light gray in FIG. 7) is noted. Subsequently, a rectangle circumscribing the generally round portion is drawn, and a length $L_a$ (in μm) of the longer side of the rectangle and a length $L_b$ (in μm) of the shorter side of the rectangle are determined. Note that the rectangle is set such that the longer side or the shorter side is parallel to a major surface of the substrate. In the present embodiment, being "parallel" is an idea which is not limited to being geometrically parallel and also includes being generally parallel. The generally round portion is counted as a droplet when the obtained $L_a$ and $L_b$ satisfy the following condition:

$$1 \le L_a/L_b < 1.3 \text{ and } 0.1 < L_a.$$

The number of such droplets is counted in a "range continuously having a length of 50 μm" at at least three locations and an average value thereof serves as the number of droplets.

When a plurality of MAlN layers are included in the coating, at least one of the plurality of MAlN layers satisfying the above-indicated condition for the number of droplets suffices.

(Another Layer)

Insofar as an effect which the present embodiment has is not impaired, the coating may further include another layer. Examples of the other layer include an underlying layer provided between the substrate and the MAlN layer and a surface layer provided on the MAlN layer, and an intermediate layer provided between the underlying layer and the MAlN layer or between the MAlN layer and the surface layer. The underlying, surface, and intermediate layers may have their respective compositions identically or differently insofar as the layers are distinguishable from the MAlN layer. The underlying layer may for example be a layer composed of a compound represented by TiN. The surface layer may for example be a layer composed of a compound represented by TiCN. The intermediate layer may for example be a layer composed of a compound represented by AlCrN. The other layer's composition can be determined by analyzing the above cross-sectional sample with at SEM-EDX throughout the other layer. While the other layer is not particularly limited in thickness insofar as it does not impair an effect of the present embodiment, it has a thickness for example of 0.1 μm or more and 2 μm or less.

<<Method for Manufacturing a Surface-Coated Cutting Tool>>

A method for manufacturing, a cutting tool according to the present embodiment comprises:

preparing the substrate (hereinafter also referred to as a "first step"); and forming the MAlN layer on the substrate by high-power impulse magnetron sputtering (hereinafter also simply referred to as a "second step");

High-power impulse magnetron sputtering (HiPIMS) is a type of sputtering. HiPIMS is a deposition method in which higher power than normal sputtering is applied in a pulsed manner and atoms of a target (or a raw material) repelled by discharge are deposited on a substrate or the like.

In HiPIMS, the substrate is set in an apparatus and a target is set as a cathode, and a negative voltage is subsequently applied to the target to cause discharge. In doing so, the apparatus is internally vacuumed and filled with an inert gas (for example, Ar gas). The inert gas in the apparatus is ionized by glow discharge, and ions of the inert gas collide with a surface of the target at high speed. This collision repels atoms of the target and thus deposits them on the substrate to form a coating.

Since HiPIMS provides deposition on the principle described above, it is less likely to generate droplets than are cathode ion plating. Further, the present inventors consider that depositing the MAlN layer such as a TiAlN layer on the substrate of a cubic boron nitride sintered material through HiPIMS allows a large amount of ions of an element of a material of the target, ions of the inert gas, and ions of a reactive gas that are generated by high power of HiPIMS to be incident on the cBN grains in a pulsed manner in a short period of time. The present inventors thus consider that (111) oriented crystal grains of $M_xAl_{1-x}N$ described above are easily produced in the MAlN layer.

<First Step: Step of Preparing the Substrate>

In the first step, a substrate is prepared. As the substrate, a substrate made of the above-described cubic boron nitride sintered material is prepared. The substrate may be a commercially available substrate. The substrate may be produced in a method described below in an example. Subsequently, the cubic boron nitride sintered material can be chamfered or subjected to a prescribed process for a cutting edge to prepare a substrate made of the cubic boron nitride sintered material.

<Second Step: Step of Forming the MAlN Layer>

In the second step, the MAlN layer is formed on the substrate by high-power impulse magnetron sputtering. The method for example uses a target of the metal element M (e.g., Ti) and Al adjusted in amount depending on the composition of the MAlN layer to be formed.

For example, the second step can be performed as follows: Initially, a chip having a shape as desired is attached as a substrate in a chamber of a deposition apparatus. In doing so, it is disposed such that the substrate has the flank face to face the target. For example, the substrate is attached to a substrate holder set on a rotary table rotatably provided at the center in the chamber of the deposition apparatus. A bias power supply is connected to the substrate holder. Ar gas and nitrogen gas are introduced while the rotary table is rotated at the center in the chamber. Further, sputtering power (for example having an average power of 10 kW, a frequency of 2,000 Hz, and a pulse width of 100 μs) is applied to the target for forming the MAlN layer while maintaining the substrate at a temperature of 400 to 600° C., a reactant gas at a pressure at 300 mPa to 3,000 mPa, and the bias power source to have a voltage in a range of −200 to 20 V. This repels metal atoms from the target for forming the MAlN layer, and once a predetermined period of time has elapsed, applying the sputtering power is stopped, and the MAlN layer is formed on a surface of the substrate. In doing so, the deposition time is adjusted to allow the MAlN layer to have a thickness falling within a predetermined range. In the second step, the MAlN layer may be formed on a portion involved in a cutting process (e.g., rake and flank faces in a vicinity of the cutting edge), and in addition thereto, on a surface of the substrate other than the portion involved in the cutting process.

(Raw Material for MAlN Layer)

In the second step, the MAlN layer is formed of a material including the metal element M and Al. When the MAlN layer is a TiAlN layer, a raw material for the TiAlN layer includes Ti and Al. A raw material for the TiAlN layer is for example a powdery sintered alloy of Ti and Al.

In the present embodiment, the reactant gas is appropriately set depending on the composition of the MAlN layer. The reactant gas includes a gaseous mixture of nitrogen gas and inert gas for example.

In one aspect of the present embodiment, the substrate may have a surface etched before the MAlN layer is deposited. The etching is performed for example under the following conditions:

Etching Conditions

Inert gas: Ar gas

Temperature. 550° C.

Pressure: 1000 mPa

Voltage: pulsed DC voltage (of 800V, with a frequency of 50 kHz and a pulse width of 10 μs)

Processing time: 20 to 30 min.

<Another Step>

In the manufacturing method according to the present embodiment, in addition to the above-described steps, the step of forming an underlying layer on the substrate, the step of forming an intermediate layer on the underlying layer or the MAlN layer, the step of forming a surface layer on the MAlN layer, the step of surface treatment, and the like may be performed as appropriate. When another layer, such as the underlying, intermediate, surface, and other layers, is form, the other layer may be formed in a conventional method. Specifically, for example, the other layer may be formed through physical vapor deposition (PVD) different from HiPIMS. The step of surface treatment includes a surface treatment using a medium with an elastic material carrying powdery diamond, for example.

What has been described above includes features indicated in the following additional notes.

(Additional Note 1)

A surface-coated cutting tool comprising a rake face and a flank face, the surface-coated cutting tool being composed of a substrate made of a cubic boron nitride sintered material and a coating provided on the substrate, the cubic boron nitride sintered material including cubic boron nitride, the coating including a TiAlN layer, the TiAlN layer including cubic $Ti_xAl_{1-x}N$ crystal grains, in the $Ti_xAl_{1-x}N$, Ti having an atomic ratio x of 0.3 or more and 0.7 or less, the cubic boron nitride being contained at a ratio of 20% by volume or more with respect to the cubic boron nitride sintered material, when a cross section of the TiAlN layer obtained when cut along a plane including a normal to the flank face is subjected to an electron backscattering diffraction image analysis using a field emission scanning microscope to determine a crystal orientation of each of the crystal grains of the and a color map is created based thereon, then on the color map, the flank face having the TiAlN layer occupied in area by 45% or more and less than 75% by crystal grains of the $Ti_xAl_{1-x}N$ having a (111) plane with a normal thereto extending in a direction within 25 degrees with respect to a direction in which a normal to the flank face extends, the TiAlN layer having a residual stress of −2 GPa or more and −0.1 GPa or less.

(Additional Note 2)

The surface-coated cutting tool according to additional note 1, wherein the flank face has the TiAlN layer occupied in area by 55% or more and less than 75% by the crystal grains of the $Ti_xAl_{1-x}N$ having the (111) plane with the normal thereto extending in the direction within 25 degrees with respect to the direction in which the normal to the flank face extends.

(Additional Note 3)

The surface-coated cutting tool according to additional note 1 or 2, wherein the coating has a thickness of 0.5 μm or more and less than 10 μm.

(Additional Note 4)

The surface-coated cutting tool according to any one of additional notes 1 to 3, wherein the TiAlN layer further includes Ar, and the Ar is contained at a ratio of 0.1 at % or more and 5 at % or less with respect to the TiAlN layer.

(Additional Note 5)

The surface-coated cutting tool according to any one of additional notes 1 to 4, wherein a number $n_D$ of droplets per 50 μm in length of the TiAlN layer at the flank face in a cross section of the TiAlN layer obtained when the TiAlN layer is cut along the plane including the normal to the flank face, is 2 or less.

EXAMPLES

Hereinafter, the present invention will more specifically be described with reference to examples although the present invention is not limited thereto.

Experiment 1

<<Manufacturing a Cutting Tool>>
<First Step: Preparing a Substrate>

Initially, TiN, Ti and Al as a binder were mixed to obtain a powdery raw material for the binder. Subsequently, the powdery raw material for the binder and powdery cubic boron nitride (powdery cBN) were mixed to obtain a powdery mixture. The obtained powdery mixture was introduced into a container. The powdery mixture introduced in the container was sintered for 20 minutes at a temperature of 1400° C. under a pressure of 5 GPa to obtain a cubic boron nitride sintered material. The obtained cubic boron nitride sintered material was processed into a shape of CNGA120408 according to the ISO standard to obtain a substrate of the cubic boron nitride sintered material.

<Depositing the Coating>
(Second Step: Depositing TiAlN Layer)

On the substrate of the cubic boron nitride sintered material obtained in the first step, a TiAlN layer as the MAIN layer was formed through HiPIMS. That is, a plurality of targets were disposed in a deposition apparatus and the substrate was attached to a rotary substrate holder provided at the center of these targets, and deposition is done through the following procedure.

Initially, the deposition apparatus was internally vacuumed to 20 mPa, and subsequently heated to around 550° C. Subsequently, Ar gas was introduced. Subsequently, a puking DC voltage of 800 V (frequency: 50 kHz, and pulse width: 10 μs) was applied to the substrate in an atmosphere of 1000 mPa to generate a plasma of Ar to etch a surface of the substrate (for 30 minutes).

Subsequently, Ar gas and $N_2$ gas were introduced into the deposition apparatus and adjusted to provide a total pressure of 300 mPa (partial pressure: Ar: 200 mPa, and $N_2$: 100 mPa) Subsequently, a bias voltage of −80 V was applied to the substrate and sputtering power (average power: 10 kW, frequency: 2,000 Hz, pulse width: 100 μs) was applied to a cathode (a target metal of a TiAl sintered alloy) to sputter the target metal to form a TiAlN layer. The atomic ratio of Ti and that of Al in the TiAlN layer were adjusted by varying the ratio of Ti and that of Al in the target metal. The TiAlN layer was adjusted in thickness by deposition time. Cutting tools for sample Nos. 1 to 20 were thus fabricated.

For sample No. 14, instead of HiPIMS, conventional are cathode ion plating was employed to form the TiAlN layer on the substrate.

(Depositing an Underlying Layer and a Surface Layer)

For sample Nos. 1 to 6 and 15 to 20, HiPIMS was employed to form an underlying layer between the substrate of the cubic boron nitride sintered material and the TiAlN layer. Table 1 shows the underlying layer's composition and thickness.

Further, for sample Nos. 12 to 14, a cold cathode are method was employed to form a surface layer on the TiAlN layer. Table 1 shows the surface laser's composition and thickness. In Table 1, and Table 2, which will be described hereinafter, a matter of an item indicated across a plurality of samples means that it is identical for the plurality of samples. For example, in Table 1, sample Nos. 1 to 6 indicate that they all have an underlying layer composed of $Al_{0.7}Cr_{0.3}N$.

<<Evaluating Characteristics or Cutting Tools>>

Using the cutting tools of sample Nos. 1 to 20 manufactured as described above, the cutting tools' characteristics were evaluated as follows:

<Average Grain Diameter of Cubic Boron Nitride>

Average grain diameter R of the cubic boron nitride in the cubic boron nitride sintered material was determined in the above-described cutting method using a scanning electron microscope (SEM). A result thereof is shown in Table 1.

<Ratio of Cubic Boron Nitride Contained>

The ratio of the cubic boron nitride contained in the cubic boron nitride sintered material was determined in the method described above, That is, an image of a sample of the cubic boron nitride sintered material in a cross section as described above was captured with an SEM and analyzed. A result thereof is shown in Table 1.

<Measuring Thickness of Each Layer Configuring the Coating>

The coating's constituent layers (i.e., the underlying, and surface layers) are each measured in thickness by measuring any 10 points in a sample of the coating in a cross section parallel to the direction of a normal to a surface of the substrate with an SEM (manufactured by JEOL Ltd., trade name: JEM-2100F), and calculating an average value of the measured 10 points in thickness. This was done by observing the sample at a magnification of 10,000 times. A result thereof is shown in Table 1.

<Measuring Atomic Ratio x of Ti in $Ti_xAl_{1-x}N$>

The atomic ratio x of Ti in $Ti_xAl_{1-x}N$ was determined in the method described above. Specifically, any 10 points in the TiAlN layer in the above-described cross-sectional sample are each measured with an SEM-EDX device to obtain a value of the x, and an average value of such values obtained at the 10 points is defined as x in the $Ti_xAl_{1-x}N$. A result thereof is shown in Table 1.

<Measuring Composition of Underlying Layer and Composition of Surface Layer>

The underlying and surface layers' respective compositions were determined by observing the above-described cross-sectional sample with the SEM-EDX device to analyze the entirety of a layer to be analyzed. A result is shown in Table 1.

<Measurement of Crystal Orientation in TiAlN Layer of Flank Face>

Figure 8:
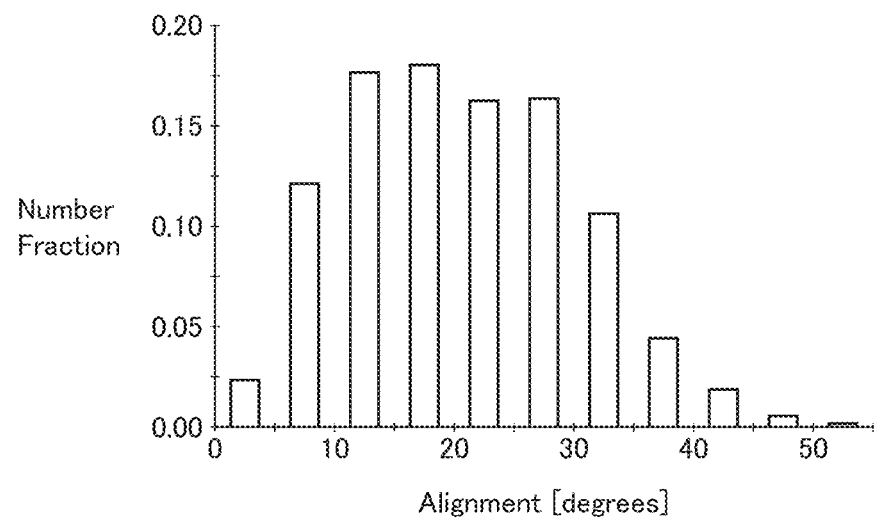
FIG. 8 is a graph showing a distribution in orientation of crystal grains in a TiAlN layer (a MAlN layer) of the cutting tool according to the present embodiment.
Figure 9:
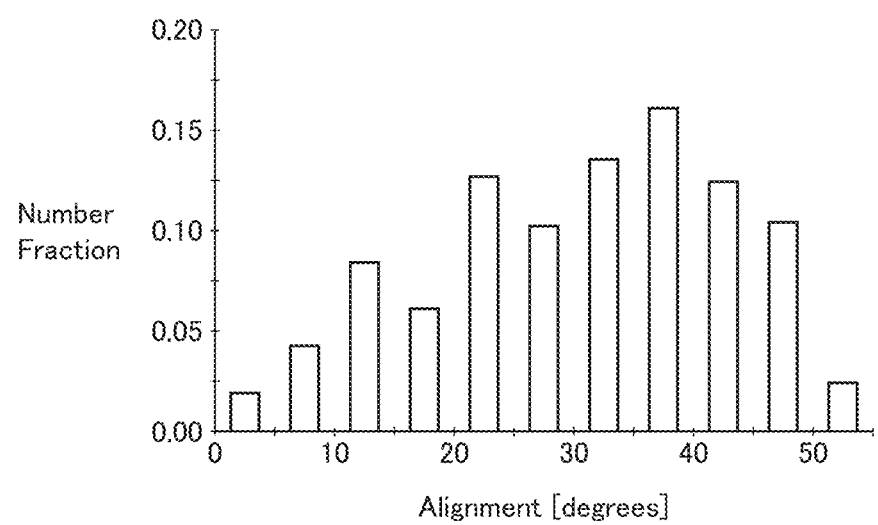
FIG. 9 is a graph showing a distribution in orientation of crystal grains in a TiAlN layer (a MAlN layer) of the cutting tool of the comparative example.

Initially, the cutting tool was cut so that a cross section perpendicular to a surface (or an interface) of the TiAlN layer in the coating was obtained, as described above. Subsequently, the cut surface was polished with waterproof abrasive paper (manufactured by Noritake Coated Abrasive Co., Ltd (NCA), trade name: WATERPROOF PAPER, #400, #800, #1500) to prepare a processed surface of the TiAlN layer. Subsequently, the processed surface is further smoothed by ion milling using Ar ions. The ion milling was performed under the following conditions:

Acceleration voltage: 6 kV
Irradiation angle: 0° from the direction of a normal to the TiAlN layer (that is, the direction of a straight line parallel to the direction of the thickness of the TiAlN layer at the cut surface)
Irradiation time: 8 hours The thus prepared processed surface was observed with an EBSD quipped FE-SEM (trade name: "SU6600" manufactured by Hitachi High-Technologies Corporation) at a magnification of 5000 times to create the above-described color map for the processed surface in an observation area of 6 μm (in the direction of the thickness of the TiAlN layer)×50 μm (in a direction parallel to an interface of the TiAlN layer). Three such color maps were created (in other words, measurement was done in three fields of view). Specifically, initially, the crystal orientation of each crystal grain included in the cross section of the TiAlN layer was determined. Based on the crystal orientation of each crystal grain determined, the crystal orientation of each crystal grain in the direction of the normal to the surface of the TiAlN layer was determined. A color map was created based on the determined crystal orientation (for example, see FIG. 6). For each color map, a ratio in area of the TiAlN layer at the flank face occupied by (111) oriented crystal grains was determined using commercially available software (trade name: "Orientation Imaging Microscopy Ver 6.2" manufactured by EDAX Inc.). A result thereof is shown in Table 2. Further, based on a result of the color map, a graph was created to show distribution in orientation of crystal grains in the TiAlN layer (see FIGS. 8 and 9).

<Measuring Residual Stress of TiAlN Layer>

The TiAlN layer's residual stress was determined in the method described above. Specifically, the TiAlN layer was analyzed at any three points in the $2\theta-\sin^2\psi$ method (or side inclination method) using an X-ray, and an average of values in residual stress obtained at these three points is defined as the residual stress in the TiAlN layer. A result is shown in Table 2.

<Measuring the Ratio of Ar Contained in TiAlN Layer>

The ratio of Ar contained in TiAlN layer was determined in the method described above. Specifically, any 10 points in the TiAlN layer in the above-described cross-sectional sample were each measured with an SEM-EDX device to obtain a ratio of Ar contained, and an average of such values obtained at the 10 points is defined as the ratio of Ar contained. A result thereof is shown in Table 1.

<Counting the Number of Droplets TiAlN Layer at the Flank Face>

The number of droplets per 50 μm in length of the TiAlN layer was determined in the method described above. That is, the above-described cross sectional sample was observed with an SEM at a magnification of 5,000 times to obtain an SEM In doing so, the SEM image was obtained so that the TiAlN layer was continuously included in a range of a length of 50 μm. The obtained SEM image was visually confirmed, and the number of droplets in the range continuously having the length of 50 μm was counted. A result is shown in Table 2.

TABLE 1

| samples | substrate of cBN sintered material | | underlying layer | | TiAlN layer | | | surface layer | |
|---|---|---|---|---|---|---|---|---|---|
| | average grain diameter R of cBN (μm) | ratio of cBN contained (vol %) | composition | thickness (μm) | atomic ratio x of Ti in $Ti_xAl_{1-x}N$ | thickness (μm) | ratio of Ar contained (at %) | composition | thickness (μm) |
| 1 | 4 | 72 | $Al_{0.7}Cr_{0.3}N$ | 0.2 | 0.45 | 4.0 | lower than detection limit | none | — |
| 2 | | | | | | | | | |
| 3 | | | | | | | | | |
| 4 | | | | | | | | | |
| 5 | | | | | | | | | |
| 6 | | | | | | | | | |
| 7 | 1 | 80 | none | — | 0.65 | 0.5 | 0.5 | none | — |
| 8 | | | | | | | | | |
| 9 | | | | | | | | | |

TABLE 1-continued

| | substrate of cBN sintered material | | | | TiAlN layer | | | | |
|---|---|---|---|---|---|---|---|---|---|
| | average grain | | | | | | | | |
| | diameter R | ratio of cBN | underlying layer | | atomic ratio x | | ratio of Ar | surface layer | |
| samples | of cBN (μm) | contained (vol %) | composition | thickness (μm) | of Ti in $Ti_xAl_{1-x}N$ | thickness (μm) | contained (at %) | composition | thickness (μm) |
| 10 | | | | | | | | | |
| 11 | | | | | | | | | |
| 12 | 3 | 55 | none | — | 0.35 | 6 | lower than detection limit | TiCN | 1 |
| 13 | | | | | | | | | |
| 14 | | | | | | | | | |
| 15 | 1 | 80 | $Al_{0.8}Ti_{0.2}N$ | 0.03 | 0.8 | 2 | 3 | | |
| 16 | | | | | 0.65 | | | | |
| 17 | | | | | 0.55 | | | none | — |
| 18 | | | | | 0.45 | | | | |
| 19 | | | | | 0.32 | | | | |
| 20 | | | | | 0.2 | | | | |

TABLE 2

| | TiAlN layer | | | | cutting test | |
|---|---|---|---|---|---|---|
| | atomic ratio x | ratio in area occupied by (111) oriented | no. of | | | |
| samples | of Ti in $Ti_xAl_{1-x}N$ | crystal grains (%) | droplets in flank face* | residual stress (GPa) | cutting condition | cutting life |
| 1 | 0.45 | 35 | 0 | −0.5 | cutting test 1 | 6 min. |
| 2 | | 48 | | | | 21 min. |
| 3 | | 57 | | | | 39 min. |
| 4 | | 65 | | | | 51 min. |
| 5 | | 72 | | | | 45 min. |
| 6 | | 80 | | | | 9 min. |
| 7 | 0.65 | 70 | 1.3 | 0.2 | cutting test 2 | 0 workpiece |
| 8 | | | | −0.2 | | 4 workpieces |
| 9 | | | | −0.5 | | 6 workpieces |
| 10 | | | | −1.2 | | 8 workpieces |
| 11 | | | | −2.5 | | 1 workpiece |
| 12 | 0.35 | 60 | 0 | −0.7 | cutting test 3 | 14 min. |
| 13 | | 60** | 0 | −0.7 | | 6 min. |
| 14 | | 60** | 5 | −0.5 | | 4 min. |
| 15 | 0.8 | 70 | 0 | −1 | cutting test 1 | less than 2 min. |
| 16 | 0.65 | | | | | 10 min. |
| 17 | 0.55 | | | | | 15 min. |
| 18 | 0.45 | | | | | 25 min. |
| 19 | 0.32 | | | | | 35 min. |
| 20 | 0.2 | | | | | less than 5 min. |

*Number per 50 μm in length of TiAlN layer
**Ratio of (100) oriented crystal grains <<Cutting Test>>
(Cutting Test 1: Turning an External Periphery)
Using the cutting tools of the thus prepared samples (sample Nos. 1 to 6 and 15 to 20) under the cutting conditions indicated below, a cutting time (min.) reached when the flank face was worn by an amount of 0.2 mm or the cutting edge portion was chipped was measured. A result thereof is shown in Table 2. A cutting tool allowing a longer cutting time can be evaluated as a cutting tool excellent in wear resistance and chipping resistance. In this cutting test, sample Nos. 2 to 5 and 16 to 19 correspond to examples. Sample Nos. 1, 6, 15 and 20 correspond to comparative examples.
Conditions for Cutting Test 1
  Shape of cutting tool: CNGA120408
  Workpiece: SCM415H (HRC60) (a cylindrical member having a diameter of 100 mm and a length of 250 mm
  Cutting speed: 180 m/min.
  Feed rate: 0.2 mm/rev
  Cutting Depth: 0.2 mm
  Cutting fluid: dry type As can be seen in Table 2, the cutting tools of sample Nos. 2 to 5 achieved a good result, that is, a cutting time of 21 minutes or longer. The cutting tools of Sample Nos. 1 and 6 provided a cutting time of 9 minutes or shorter. From the above result, it has been found that the cutting tools of the examples are excellent in wear resistance and chipping resistance.

As can be seen in Table 2, the cutting tools of sample Nos. 16 to 19 achieved a good result, that is, a cutting time of 10 minutes or longer. The cutting tools of Sample Nos. 15 and 20 provided a cutting time of 5 minutes or shorter. From the above results, it has been found that the cutting tools of the examples are excellent in wear resistance and chipping resistance.

(Cutting Test 2: Turning an External Periphery)

Using the cutting tools of the thus prepared samples (sample Nos. 7 to 11) under the cutting conditions indicated below, the number of workpieces processed before the flank face was worn by an amount of 0.2 mm or the cutting edge portion was chipped (hereinafter also simply referred to as the "number of workpieces") was counted. A result thereof is shown in Table 2. A cutting tool having processed a larger number of workpieces can be evaluated as a cutting tool excellent in chipping resistance. In this cutting test, sample Nos. 8 to 10 correspond to examples. Sample Nos. 7 and 11 correspond to comparative examples.

Conditions for Cutting Test 2
  Shape of cutting tool: CNGA120408
  Workpiece: SCM415H (HC60) (a cylindrical member having a diameter of 50 mm and a length of 100 mm and circumferentially provided with four grooves each having a width of 5 mm and a depth of 5 mm and provided at every 90 degrees.) The workpiece was circumferentially processed from one end longitudinally by 40 mm.)
  Cutting speed: 120 m/min.
  Feed rate: 0.1 mm/rev
  Cutting Depth: 0.2 mm
  Cutting fluid: dry type As can be seen in Table 2, the cutting tools of sample Nos. 8 to 10 achieved a good result, that is, processed 4 or more workpieces. The cutting tools of Sample Nos. 7 and 11 processed one or less workpiece. From the above result, it has been found that the cutting tools of the examples had excellent chipping resistance.

(Cutting Test 3: Turning an External Periphery)

Using the cutting tools of the thus prepared samples (sample Nos. 12 to 14) under the cutting conditions indicated below, a cutting time (min.) reached when the flank face was worn by an amount of 0.2 mm was measured. A result thereof is shown in Table 2. A cutting tool providing a longer cutting time can be evaluated as a cutting tool with excellent wear resistance. In this cutting test, sample No. 12 corresponds to an example. Sample Nos. 13 and 14 correspond to comparative examples.

Conditions for Cutting Test 3
  Shape of cutting tool: CNGA120408
  Workpiece: SUJ2 (HRC62) (a cylindrical member having a diameter of 140 mm and length of 300 mm)
  Cutting speed: 120 m/min
  Feed rate: 0.1 mm/rev
  Cutting Depth: 0.1 mm
  Cutting fluid: wet type As can be seen in Table 2, the cutting tool of sample No. 12 achieved a good result, that is, a cutting time of 14 minutes. The cutting tools of Sample Nos. 13 and 14 provided a cutting time of 6 minutes or shorter. From the above result, it has been found that the cutting tool of the example had excellent wear resistance.

Experiment 2

<<Manufacturing a Cutting Tool>>
<First Step: Preparing a Substrate>

The same method as experiment 1 was employed to obtain a substrate of a cubic boron nitride sintered material having a shape of CNGA120408 according to the ISO standard.

<Depositing the Coating>
(Second Step: Depositing the MAIN Layer)

An MAIN layer was formed on the substrate in the same manner as in Experiment 1 except that the target was changed so that the MAIN layer had a composition shown in Table 3. Cutting tools for sample Nos. 21 to 38 were thus fabricated. Note that the cutting tools or sample Nos. 21 to 38 were all configured to comprise a coating without including the underlying layer and the surface layer therein <<Evaluating Characteristics of Cutting Tools>>

Using the cutting tools of sample Nos. 21 to 38 manufactured as described above, the cutting tools' characteristics were evaluated as done in Experiment 1. A result thereof is shown in Tables 3 and 4.

<<Cutting Test>>

(Cutting Test 4: Turning an External Periphery)

Using the cutting tools of the thus prepared samples (sample Nos. 21 to 29) under the cutting conditions indicated below, a cutting time (min.) reached when the flank face was worn by an amount of 0.2 mm or the cutting edge portion was chipped was measured. The amount of the flank face worn was measured every 5 minutes as counted from when cutting was started. A result thereof is shown in Table 4. A cutting tool providing a longer cutting time can be evaluated as a cutting tool excellent in wear resistance and chipping resistance. In this cutting test, sample Nos. 21 to 28 correspond to examples. Sample No. 29 corresponds to a comparative example.

Conditions for Cutting Test 4
  Shape of cutting tool: CNGA120408
  Workpiece: SCM415H (HRC60) (a cylindrical member having a diameter of 100 mm and a length of 250 mm)
  Cutting speed: 220 m/min.
  Feed rate: 0.2 mm/rev
  Cutting Depth: 0.2 mm
  Cutting fluid: dry type (Cutting Test 5: Turning an External Periphery)

Using the cutting tools of the thus prepared samples (sample Nos. 30 to 33) under the cutting conditions indicated below, the number of workpieces processed before the flank face was worn by an amount of 0.2 mm or the cutting edge portion was chipped (hereinafter also simply referred to as the "number of workpieces") was counted. A result thereof is shown in table 4. A cutting tool having processed a larger number of workpieces (e.g., five or more workpieces) can be evaluated as a cutting tool excellent in wear resistance and chipping resistance. In this cutting test, sample Nos. 30 to 33 correspond to examples.

Conditions for Cutting Test 5
  Shape of cutting tool: CNGA120408
  Workpiece: SCM415H (HRC60) (a cylindrical member having a diameter of 50 mm and a length of 100 mm and circumferentially provided with one groove (having a width of 2 mm and a depth of 5 mm.) The workpiece was circumferentially processed from one end longitudinally by 40 mm.)
  Cutting speed: 100 m/min.
  Feed rate: 0.1 mm/rev
  Cutting Depth: 0.1 mm
  Cutting fluid: dry type (Cutting Test 6: Turning External Periphery)

Using the cutting tools of the thus prepared samples (sample Nos. 34 to 38) under the cutting conditions indicated below, a cutting time (min.) reached when the flank face was worn by an amount of 0.2 mm was measured. The amount of the flank face worn was measured every 5 minutes as counted from when cutting was started. A result thereof is shown in Table 4. A cutting tool providing a longer cutting time can be evaluated as a cutting tool excellent in wear resistance and chipping resistance. In this cutting test, sample Nos. 34 and 35 correspond to examples. Sample Nos. 36 to 38 correspond to comparative examples.

Conditions for Cutting Test 6

Shape of cutting tool: CNGA120408

Workpiece: SUJ2 (HRC62) (a cylindrical member having a diameter of 140 mm and a length of 300 mm)

Cutting speed: 150 m/min.

Feed rate: 0.2 mm/rev

Cutting Depth: 0.1 mm

Cutting fluid: wet type

TABLE 3

| samples* | substrate of cBN sintered material | | MAIN layer | | | | | | |
|---|---|---|---|---|---|---|---|---|---|
| | average grain diameter R of cBN (μm) | ratio of cBN contained (vol %) | metal element M | | | | atomic ratio x of M in $M_xAl_{1-x}N$ | thickness (μm) | ratio of Ar contained (at %) |
| | | | atomic ratio w of Ti | atomic ratio y of Cr | 3rd element | atomic ratio z of 3rd element | | | |
| 21 | 4 | 60 | 0.45 | 0 | B | 0.05 | 0.5 | 3.0 | lower than detection limit |
| 22 | 4 | 60 | 0.4 | 0.2 | B | 0 | 0.6 | 3.0 | lower than detection limit |
| 23 | 4 | 60 | 0.05 | 0.3 | V | 0.1 | 0.45 | 3.0 | lower than detection limit |
| 24 | 4 | 60 | 0.2 | 0.25 | Nb | 0.1 | 0.55 | 3.0 | lower than detection limit |
| 25 | 4 | 60 | 0.4 | 0 | Mo | 0.1 | 0.5 | 3.0 | lower than detection limit |
| 26 | 4 | 60 | 0.4 | 0 | Hf | 0.03 | 0.43 | 3.0 | lower than detection limit |
| 27 | 4 | 60 | 0.4 | 0 | Ta | 0.08 | 0.48 | 3.0 | lower than detection limit |
| 28 | 4 | 60 | 0.4 | 0 | W | 0.1 | 0.5 | 3.0 | lower than detection limit |
| 29 | 4 | 60 | $W_{0.2}Hf_{0.2}Al_{0.6}N$ | | | | | 3.0 | lower than detection limit |
| 30 | 2 | 70 | 0 | 0.3 | — | 0 | 0.3 | 2.0 | lower than detection limit |
| 31 | 2 | 70 | Deposit $Ti_{0.6}Al_{0.4}N$ (0.7 μm) & $Cr_{0.35}Al_{0.65}N$ (0.3 μm) each 3 times | | | | | 3.0 | lower than detection limit |
| 32 | 2 | 70 | Deposit $Ti_{0.6}Al_{0.45}Si_{0.05}N$ (0.15 μm) & $Cr_{0.4}Al_{0.6}N$ (0.15 μm) each 10 times | | | | | 2.0 | lower than detection limit |
| 33 | 2 | 70 | Deposit $Ti_{0.4}Al_{0.6}N$ (0.75 μm) & $Cr_{0.3}Al_{0.7}N$ (0.75 μm) each twice | | | | | 2.0 | lower than detection limit |
| 34 | 5 | 45 | 0.35 | 0.05 | Zr | 0.05 | 0.45 | 6.5 | lower than detection limit |
| 35 | 5 | 45 | 0.1 | 0.1 | Zr | 0.5 | 0.7 | 6.5 | lower than detection limit |
| 36 | 5 | 45 | 0.05 | 0.05 | Zr | 0.05 | 0.15 | 6.5 | lower than detection limit |
| 37 | 5 | 45 | 0.5 | 0.1 | Zr | 0.2 | 0.8 | 6.5 | lower than detection limit |
| 38 | 5 | 45 | 0.4 | 0.4 | Zr | 0.1 | 0.9 | 6.5 | lower than detection limit |

*Samples 21 to 38 did not form underlying layer and surface layer.

TABLE 4

| samples | MAIN layer | | | | cutting test | |
|---|---|---|---|---|---|---|
| | atomic ratio x of M in $M_xAl_{1-x}N$ | ratio in area occupied by (111) oriented crystal grains (%) | no. of droplets in flank face* | residual stress (GPa) | cutting condition | cutting life |
| 21 | 0.5 | 57 | 0.25 | −0.8 | cutting test 4 | 35 min. |
| 22 | 0.6 | 57 | 0.25 | −0.8 | | 25 min. |
| 23 | 0.45 | 63 | 0.25 | −0.8 | | 35 min. |
| 24 | 0.55 | 70 | 0.25 | −0.8 | | 25 min. |
| 25 | 0.5 | 63 | 0 | −1.3 | | 30 min. |
| 26 | 0.43 | 58 | 0 | −1.3 | | 35 min. |
| 27 | 0.48 | 58 | 0 | −1.3 | | 30 min. |
| 28 | 0.5 | 58 | 0 | −1.3 | | 30 min. |
| 29 | 0.4 | 50 | 0 | −1.3 | | 10 min. |
| 30 | 0.3 | 60 | 0.3 | −1.1 | cutting test 5 | 5 workpieces |
| 31 | 0.6 & 0.35 | 65 | 0.3 | −0.6 | | 6 workpieces |
| 32 | 0.55 & 0.4 | 60 | 0.3 | −0.6 | | 12 workpieces |
| 33 | 0.4 & 0.3 | 65 | 0.3 | −0.6 | | 8 workpieces |
| 34 | 0.45 | 60 | 1 | −0.3 | cutting test 6 | 35 min. |
| 35 | 0.7 | 60 | 1 | −0.3 | | 25 min. |
| 36 | 0.15 | 10 | 1.7 | −0.3 | | 5 min. |
| 37 | 0.8 | 60 | 0.7 | −0.3 | | 12 min. |
| 38 | 0.9 | 60 | 0.7 | −0.3 | | 9 min. |

*Number per 50 μm in length of MAIN layer

Table 4 shows that the cutting tools of the examples are excellent in wear resistance and chipping resistance.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST

1*a* rake face, 1*b* flank face, 1*c* cutting edge face, 10 cutting tool, 11 substrate, 12 MAlN layer, 12*a* (111) oriented crystal grains, 13 underlying layer, 14 surface layer, 20 coating.

The invention claimed is:

1. A cutting tool comprising a rake face and a flank face, the cutting tool being composed of a substrate made of a cubic boron nitride sintered material and a coating provided on the substrate, the cubic boron nitride sintered material including cubic boron nitride, the coating including a MAlN layer, in the MAlN layer, M representing a metal element including titanium, chromium, or both, the MAlN layer including crystal grains of $M_xAl_{1-x}N$ in the cubic crystal system, in the $M_xAl_{1-x}N$, the metal element M having an atomic ratio x of 0.3 or more and 0.7 or less, the cubic boron nitride being contained at a ratio of 20% by volume or more with respect to the cubic boron nitride sintered material, when a cross section of the MAlN layer obtained when cut along a plane including a normal to the flank face is subjected to an electron backscattering diffraction image analysis using a field emission scanning microscope to determine a crystal orientation of each of the crystal grains of the $M_xAl_{1-x}N$ and a color map is created based thereon, then on the color map, the flank face having the MAlN layer occupied in area by 45% or more and less than 75% by crystal grains of the $M_xAl_{1-x}N$ having a (111) plane with a normal thereto extending in a direction within 25 degrees with respect to a direction in which a normal to the flank face extends, the MAlN layer having a residual stress of −2 GPa or more and −0.1 GPa or less, wherein a number np of droplets per 50 μm in length of the MAlN layer at the flank face in the cross section of the MAlN layer obtained when the MAlN layer is cut along the plane including the normal to the flank face, is 2 or less, the droplets are grains of metal that are present in the MAlN layer, a virtual rectangle circumscribing each of the grains of the metal in the cross section has a length $L_a$ in μm of a longer side of the rectangle and a length $L_b$ in μm of a shorter side of the rectangle that satisfy following condition: $1 \leq L_a/L_b < 1.3$ and $0.1 < La$, and the longer side or the shorter side is parallel to a major surface of the substrate.

2. The cutting tool according to claim 1, wherein the metal element M further includes at least one element selected from the group consisting of boron, silicon, vanadium, zirconium, niobium, molybdenum, hafnium, tantalum, and tungsten.

3. The cutting tool according to claim 1, wherein the flank face has the MAlN layer occupied in area by 55% or more and less than 75% by the crystal grains of the $M_xAl_{1-x}N$ having the (111) plane with the normal thereto extending in the direction within 25 degrees with respect to the direction in which the normal to the flank face extends.

4. The cutting tool according to claim 1, wherein the coating has a thickness of 0.5 μm or more and less than 10 μm.

5. The cutting tool according to claim 1, wherein the MAlN layer further includes Ar, and the Ar is contained at a ratio of 0.1 at % or more and 5 at % or less with respect to the MAlN layer.

6. The cutting tool according to claim 1, wherein the number no of droplets per 50 μm in length of the MAlN layer at the flank face in the cross section of the MAlN layer obtained when the MAlN layer is cut along the plane including the normal to the flank face, is more than 0 and 2 or less.

\* \* \* \* \*